US007123655B2

United States Patent
Kerofsky

(10) Patent No.: US 7,123,655 B2
(45) Date of Patent: Oct. 17, 2006

(54) METHOD FOR REDUCED BIT-DEPTH QUANTIZATION

(75) Inventor: Louis Joseph Kerofsky, Portland, OR (US)

(73) Assignee: Sharp Laboratories of America, Inc., Camas, WA (US)

( * ) Notice: Subject to any disclaimer, the term of this patent is extended or adjusted under 35 U.S.C. 154(b) by 622 days.

(21) Appl. No.: 10/139,036

(22) Filed: May 2, 2002

(65) Prior Publication Data

US 2003/0206585 A1    Nov. 6, 2003

Related U.S. Application Data

(60) Provisional application No. 60/319,018, filed on Nov. 30, 2001, provisional application No. 60/311,436, filed on Aug. 9, 2001.

(51) Int. Cl.
H04B 1/66 (2006.01)
(52) U.S. Cl. .................................. 375/240.03
(58) Field of Classification Search ........... 375/240.03, 375/240.18, 240.2; 382/247–248, 250–251; 341/200; H04B 1/66
See application file for complete search history.

(56) References Cited

U.S. PATENT DOCUMENTS

| 5,230,038 | A | 7/1993 | Fielder et al. |
| 5,345,408 | A | 9/1994 | Hoogenboom ............... 708/402 |
| 5,471,412 | A | 11/1995 | Shyu ........................... 708/402 |
| 5,640,159 | A | 6/1997 | Furlan et al. ................... 341/51 |
| 5,754,457 | A | 5/1998 | Eitan et al. ................... 708/402 |
| 5,764,553 | A | 6/1998 | Hong et al. |
| 5,822,003 | A | 10/1998 | Girod et al. ............ 375/240.12 |
| 5,845,112 | A | 12/1998 | Nguyen et al. .............. 712/221 |
| 6,160,920 | A | 12/2000 | Shyu ........................... 382/250 |
| 2003/0099291 | A1* | 5/2003 | Kerofsky ................ 375/240.05 |
| 2003/0112876 | A1* | 6/2003 | Kerofsky ................ 375/240.25 |
| 2003/0123553 | A1* | 7/2003 | Kerofsky ................ 375/240.25 |
| 2004/0013202 | A1* | 1/2004 | Lainema ................. 375/240.18 |

FOREIGN PATENT DOCUMENTS

| JP | 04-222121 | 8/1992 |
| JP | 06-048289 | 2/1993 |
| JP | 07-099578 | 9/1993 |
| JP | 05-307467 | 11/1993 |
| JP | 06-053839 | 2/1994 |
| JP | 06-077642 | 3/1994 |
| JP | 06-077842 | 3/1994 |
| KR | 0172902 | 3/1999 |

OTHER PUBLICATIONS

Gisle Bjontegaard, "H.26L Test Model Long Term No. 8 (TML-8) draft0", document VCEG-M81, ITU-T Video Coding Experts Group (VCEG).

Hallapuro et al., "Low Complexity Transform and Quantization—Part I:Basic Implementation", Joint Video Team (JVT) of ISO/IEC MPEG & ITU-T VCEG, Document JVT-B038.

Working Draft No. 2, Revision 0 (WD-2), Joint Video Team (JVT) of ISO/IEC MPEG and ITU-T VCEG, Document JVT-B119.

(Continued)

Primary Examiner—Tung Vo
(74) Attorney, Agent, or Firm—Krieger Intellectual Property, Inc.; Scott C. Krieger

(57) ABSTRACT

Embodiments of the present systems and methods for quantization or dequantization of data related to video wherein reduced bit depth intermediate calculations are enabled.

7 Claims, 10 Drawing Sheets

OTHER PUBLICATIONS

Notes of JVT IDCT, Joint Video Team (JVT) of ISO/IEC MPEG & ITU-T VCEG, Document JVT-C24.

Modifications to the JVT IDCT, Joint Video Team (JVT) of ISO/IEC MPEG & ITU-T VCEG, Document JVT-C25.

Hallapuro et al., "Low Complexity Transform and Quantization—Part II:Extensions", Joint Video Team (JVT) of ISO/IEC MPEG & ITU-T VCEG, Document JVT-B039.

"H 26L Test Model Long Term No. 8(TML-6) Drafto" ITU-T Telecommunication Standarization Sector of ITU, Geneva, CH, Apr. 2, 2001, pp. 1-54 XP001089814 Section 4. 3.3, pp. 24-25 Section 6.2, pp. 42-44.

Liang J., Tran T., Topiwala P.; "A 16-bit architecture for H.28L, treating DCT transforms and quantization" Document VCEG- M16, ITU- Telecommunications Standardization Sector Study Group 18 Question 6, Video Coding Experts Group (VCEG), Online! Apr. 2, 2001, pp. 1-17, XP002332050 Austin, Texes, USA Rerieved from the Internet; URL: http://www.ensc.sfu. ca/people/faculty/ jiel/papers/H26L__-Proposal . doc> retrieved on Jun. 08, 2005 "abstract" Section "Introduction", p. 1 Section 1.2 "Quantization in TML 5.2". pp. 2-3 Section 2.4 "Scaling factors and Quantization". pp. 6-7.

Kerofsky L., Lei S.; "Reduced bit-depth quantization" Document VCEG-N20, ITU-Telecommunications Standardization Sector, Study Group 16 Question 6, Video Coding Experts Group (VCEG), 'Online Sep. 24, 2001, pp. 1-14, XP002332061 Santa Barbara, CA USA Retrieved from the Internet: URL ftp3 itu.Int/av-arch/video-site/01.09_S AN/vceg-n20.DOC> Retrieved On Jun. 08, 2005! Section "Introduction" pp. 1-2 Section "Proposed Quantization values", pp. 3-4 Section "Appendix". Table 10 and Equations 4,5.

\* cited by examiner

METHOD FOR REDUCED BIT-DEPTH QUANTIZATION

RELATED APPLICATIONS

This application claims the benefit of U.S. Provisional Patent Application Ser. No. 60/319,018 entitled, METHODS AND SYSTEMS FOR VIDEO CODING WITH JOINT QUANTIZATION AND NORMALIZATION PROCEDURES, invented by Louis Kerofsky, filed Nov. 30, 2001, this application also claims the benefit of U.S. Provisional Patent Application Ser. No. 60/311,436 entitled, REDUCED BIT-DEPTH QUANTIZATION, invented by louis Kerofsky, filed Aug. 9, 2001.

BACKGROUND OF THE INVENTION

1. Field of the Invention

This invention generally relates to video compression techniques and, more particularly, to a method for reducing the bit size required in the computation of video coding transformations.

2. Description of the Related Art

A video information format provides visual information suitable to activate a television screen, or store on a video tape. Generally, video data is organized in a hierarchical order. A video sequence is divided into group of frames, and each group can be composed of a series of single frames. Each frame is roughly equivalent to a still picture, with the still pictures being updated often enough to simulate a presentation of continuous motion. A frame is further divided into slices, or horizontal sections which helps system design of error resilience. Each slice is coded independently so that errors do not propagate across slices. A slice consists of macroblocks. In H.26P and Motion Picture Experts Group (MPEG)-X standards, a macroblock is made up of 16×16 luma pixels and a corresponding set of chroma pixels, depending on the video format. A macroblock always has an integer number of blocks, with the 8×8 pixel matrix being the smallest coding unit.

Video compression is a critical component for any application which requires transmission or storage of video data. Compression techniques compensate for motion by reusing stored information in different areas of the frame (temporal redundancy). Compression also occurs by transforming data in the spatial domain to the frequency domain. Hybrid digital video compression, exploiting temporal redundancy by motion compensation and spatial redundancy by transformation, such as Discrete Cosine Transform (DCT), has been adapted in H.26P and MPEG-X international standards as the basis.

As stated in U.S. Pat. No. 6,317,767 (Wang), DCT and inverse discrete cosine transform (IDCT) are widely used operations in the signal processing of image data. Both are used, for example, in the international standards for moving picture video compression put forth by the MPEG. DCT has certain properties that produce simplified and efficient coding models. When applied to a matrix of pixel data, the DCT is a method of decomposing a block of data into a weighted sum of spatial frequencies, or DCT coefficients. Conversely, the IDCT is used to transform a matrix of DCT coefficients back to pixel data.

Digital video (DV) codecs are one example of a device using a DCT-based data compression method. In the blocking stage, the image frame is divided into N by N blocks of pixel information including, for example, brightness and color data for each pixel. A common block size is eight pixels horizontally by eight pixels vertically. The pixel blocks are then "shuffled" so that several blocks from different portions of the image are grouped together. Shuffling enhances the uniformity of image quality.

Different fields are recorded at different time incidents. For each block of pixel data, a motion detector looks for the difference between two fields of a frame. The motion information is sent to the next processing stage. In the next stage, pixel information is transformed using a DCT. An 8-8 DCT, for example, takes eight inputs and returns eight outputs in both vertical and horizontal directions. The resulting DCT coefficients are then weighted by multiplying each block of DCT coefficients by weighting constants.

The weighted DCT coefficients are quantized in the next stage. Quantization rounds off each DCT coefficient within a certain range of values to be the same number. Quantizing tends to set the higher frequency components of the frequency matrix to zero, resulting in much less data to be stored. Since the human eye is most sensitive to lower frequencies, however, very little perceptible image quality is lost by this stage.

The quantization stage includes converting the two-dimensional matrix of quantized coefficients to a one-dimensional linear stream of data by reading the matrix values in a zigzag pattern and dividing the one-dimensional linear stream of quantized coefficients into segments, where each segment consists of a string of zero coefficients followed by a non-zero quantized coefficient. Variable length coding (VLC) then is performed by transforming each segment, consisting of the number of zero coefficients and the amplitude of the non-zero coefficient in the segment, into a variable length codeword. Finally, a framing process packs every 30 blocks of variable length coded quantized coefficients into five fixed-length synchronization blocks.

Decoding is essentially the reverse of the encoding process described above. The digital stream is first deframed. Variable length decoding (VLD) then unpacks the data so that it may be restored to the individual coefficients. After inverse quantizing the coefficients, inverse weighting and an inverse discrete cosine transform (EDCT) are applied to the result. The inverse weights are the multiplicative inverses of the weights that were applied in the encoding process. The output of the inverse weighting function is then processed by the IDCT.

Much work has been done studying means of reducing the complexity in the calculation of DCT and IDCT. Algorithms that compute two-dimensional IDCTs are called "type I" algorithms. Type I algorithms are easy to implement on a parallel machine, that is, a computer formed of a plurality of processors operating simultaneously in parallel. For example, when using N parallel processors to perform a matrix multiplication on N×N matrices, N column multiplies can be simultaneously performed. Additionally, a parallel machine can be designed so as to contain special hardware or software instructions for performing fast matrix transposition.

One disadvantage of type I algorithms is that more multiplications are needed. The computation sequence of type I algorithms involves two matrix multiplies separated by a matrix transposition which, if N=4, for example, requires 64 additions and 48 multiplications for a total number of 112 instructions. It is well known by those skilled in the art that multiplications are very time-consuming for processors to perform and that system performance is often optimized by reducing the number of multiplications performed.

A two-dimensional IDCT can also be obtained by converting the transpose of the input matrix into a one-dimensional vector using an L function. Next, the tensor product of constant a matrix is obtained. The tensor product is then multiplied by the one-dimensional vector L. The result is converted back into an N×N matrix using the M function. Assuming again that N=4, the total number of instructions used by this computational sequence is 92 instructions (68 additions and 24 multiplications). Algorithms that perform two-dimensional EDCTs using this computational sequence are called "type II" algorithms. In type II algorithms, the two constant matrices are grouped together and performed as one operation. The advantage of type II algorithms is that they typically require fewer instructions (92 versus 112) and, in particular, fewer costly multiplications (24 versus 48). Type II algorithms, however, are very difficult to implement efficiently on a parallel machine. Type II algorithms tend to reorder the data very frequently and reordering data on a parallel machine is very time-intensive.

There exist numerous type I and type II algorithms for implementing IDCTs, however, dequantization has been treated as an independent step depending upon DCT and IDCT calculations. Efforts to provide bit exact DCT and IDCT definitions have led to the development of efficient integer transforms. These integer transforms typically increase the dynamic range of the calculations. As a result, the implementation of these algorithms requires processing and storing data that consists of more than 16 bits.

It would be advantageous if intermediate stage quantized coefficients could be limited to a maximum size in DCT processes.

It would be advantageous if a quantization process could be developed that was useful for 16-bit processors.

It would be advantageous if a decoder implementation, dequantization, and inverse DCT could be implemented efficiently with a 16-bit processor. Likewise, it would be advantageous if the multiplication could be preformed with no more than 16 bits, and if memory access required no more than 16 bits.

SUMMARY OF THE INVENTION

The present invention is an improved process for video compression. Typical video coding algorithms predict one frame from previously coded frames. The error is subjected to a transform and the resulting values are quantized. The quantizer controls the degree of compression. The quantizer controls the amount of information used to represent the video and the quality of the reconstruction.

The problem is the interaction of the transform and quantization in video coding. In the past the transform and quantizer have been designed independently. The transform, typically the discrete cosine transform, is normalized. The result of the transform is quantized in standard ways using scalar or vector quantization. In prior work, MPEG-1, MPEG-2, MPEG-4, H.261, H.263, the definition of the inverse transform has not been bit exact. This allows the implementer some freedom to select a transform algorithm suitable for their platform. A drawback of this approach is the potential for encoder/decoder mismatch damaging the prediction loop. To solve this mismatch problem portions of the image are periodically coded without prediction. Current work, for example H.26L, has focused on using integer transforms that allow bit exact definition. Integer transforms may not normalized. The transform is designed so that a final shift can be used to normalize the results of the calculation rather than intermediate divisions. Quantization also requires division. H.26L provides an example of how these integer transforms are used along with quantization.

In the current H.26L Test Model Long-term (TML), normalization is combined with quantization and implemented via integer multiplications and shifts following forward transform and quantization and following dequantization and inverse transform. H.26L TML uses two arrays of integers A[QP] and B[QP] index by quantization parameter, see Table 1. These values are constrained by the relation shown below in Equation 1.

TABL3 1

TML quantization parameters

| Qp | A-TML | B-TML |
| --- | --- | --- |
| 0 | 620 | 3881 |
| 1 | 553 | 4351 |
| 2 | 492 | 4890 |
| 3 | 439 | 5481 |
| 4 | 391 | 6154 |
| 5 | 348 | 6914 |
| 6 | 310 | 7761 |
| 7 | 276 | 8718 |
| 8 | 246 | 9781 |
| 9 | 219 | 10987 |
| 10 | 195 | 12339 |
| 11 | 174 | 13828 |
| 12 | 155 | 15523 |
| 13 | 138 | 17435 |
| 14 | 123 | 19561 |
| 15 | 110 | 21873 |
| 16 | 98 | 24552 |
| 17 | 87 | 27656 |
| 18 | 78 | 30847 |
| 19 | 69 | 34870 |
| 20 | 62 | 38807 |
| 21 | 55 | 43747 |
| 22 | 49 | 49103 |
| 23 | 44 | 54683 |
| 24 | 39 | 61694 |
| 25 | 35 | 68745 |
| 26 | 31 | 77615 |
| 27 | 27 | 89113 |
| 28 | 24 | 100253 |
| 29 | 22 | 109366 |
| 30 | 19 | 126635 |
| 31 | 17 | 141533 |

Equation 1 Joint Normalization/Quantization Relation $$A(QP) \cdot B(QP) \cdot 676^2 \approx 2^{40}.$$

Normalization and quantization are performed simultaneously using these integers and divisions by powers of 2. Transform coding in H.26L uses a 4×4 block size and an integer transform matrix T, Equation 2. For a 4×4 block X, the transform coefficients K are calculated as in Equation 3. From the transform coefficients, the quantization levels, L, are calculated by integer multiplication. At the decoder the levels are used to calculate a new set of coefficients, K'. Additional integer matrix transforms followed by a shift are used to calculate the reconstructed values X'. The encoder is allowed freedom in calculation and rounding of the forward transform. Both encoder and decoder must compute exactly the same answer for the inverse calculations.

$$T = \begin{pmatrix} 13 & 13 & 13 & 13 \\ 17 & 7 & -7 & -17 \\ 13 & -13 & -13 & 13 \\ 7 & -17 & 17 & -7 \end{pmatrix}$$

H.26L transform matrix     Equation 2

Equation 3 TML DCT_LUMA and iDCT_LUMA $$Y = T \cdot X$$

$$K = Y \cdot T^T$$

$$L = (A_{TML}(QP) \cdot K)/2^{20}$$

$$K' = B_{TML}(QP) \cdot L$$

$$Y' = T^T \cdot K'$$

$$X' = (Y' \cdot T)/2^{20}$$

The dynamic range required during these calculations can be determined. The primary application involves 9-bit input, 8 bits plus sign, the dynamic range required by intermediate registers and memory accesses is presented in Table 2.

TABLE 2

| Dynamic range of TML decoder (bits) | | |
|---|---|---|
| 9-bit input | DCT_LUMA | iDCT_LUMA |
| Register | 30 | 27 |
| Memory | 21 | 26 |

To maintain bit-exact definitions and incorporate quantization, the dynamic range of intermediate results can be large since division operations are postponed. The present invention combines quantization and normalization, to eliminate the growth of dynamic range of intermediate results. With the present invention the advantages of bit exact inverse transform and quantization definitions are kept, while controlling the bit depth required for these calculations. Reducing the required bit depth reduces the complexity required of a hardware implementation and enables efficient use of single instruction multiple data (SIMD) operations, such as the Intel MMX instruction set.

Accordingly, a method is provided for the quantization of a coefficient. The method comprises: supplying a coefficient K; supplying a quantization parameter (QP); forming a quantization value (L) from the coefficient K using a mantissa portion $(Am)(QP)$ and an exponential portion $(x^{Ae}(QP))$. Typically, the value of x is 2.

In some aspects of the method, forming a quantization value (L) from the coefficient K includes:

$$L = K * A(QP) = K * Am(QP) * (2^{Ae(QP)}).$$

In other aspects, the method further comprises: normalizing the quantization value by $2^N$ as follows:

$$Ln = \frac{L}{2^N} = K * Am \frac{(QP)}{2^{(N-Ae(QP))}}.$$

In some aspects, forming a quantization value includes forming a set of recursive quantization factors with a period P, where $A(QP+P)=A(QP)/x$. Therefore, forming a set of recursive quantization factors includes forming recursive mantissa factors, where $Am(QP)=Am(QP \bmod P)$. Likewise, forming a set of recursive quantization factors includes forming recursive exponential factors, where $Ae(QP)=Ae(QP \bmod P)-QP/P$.

More specifically, supplying a coefficient K includes supplying a coefficient matrix K[i][j]. Then, forming a quantization value (L) from the coefficient matrix K[i][j] includes forming a quantization value matrix (L[i][j]) using a mantissa portion matrix (Am(QP)[i][j]) and an exponential portion matrix ($x^{Ae(QP)[i][j]}$).

Likewise, forming a quantization value matrix (L[i][j]) using a mantissa portion matrix (Am(QP)[i][j]) and an exponential portion matrix ($x^{Ae(QP)[i][j]}$) includes, for each particular value of QP, every element in the exponential portion matrix being the same value. Every element in the exponential portion matrix is the same value for a period (P) of QP values, where $Ae(QP)=Ae(P*(QP/P))$.

Additional details of the above-described method, including a method for forming a dequantization value (X1), from the quantization value, using a mantissa portion (Bm)(QP)) and an exponential portion ($x^{Be(QP)}$), are provided below.

DETAILED DESCRIPTION OF THE PREFERRED EMBODIMENTS

Figure 1:
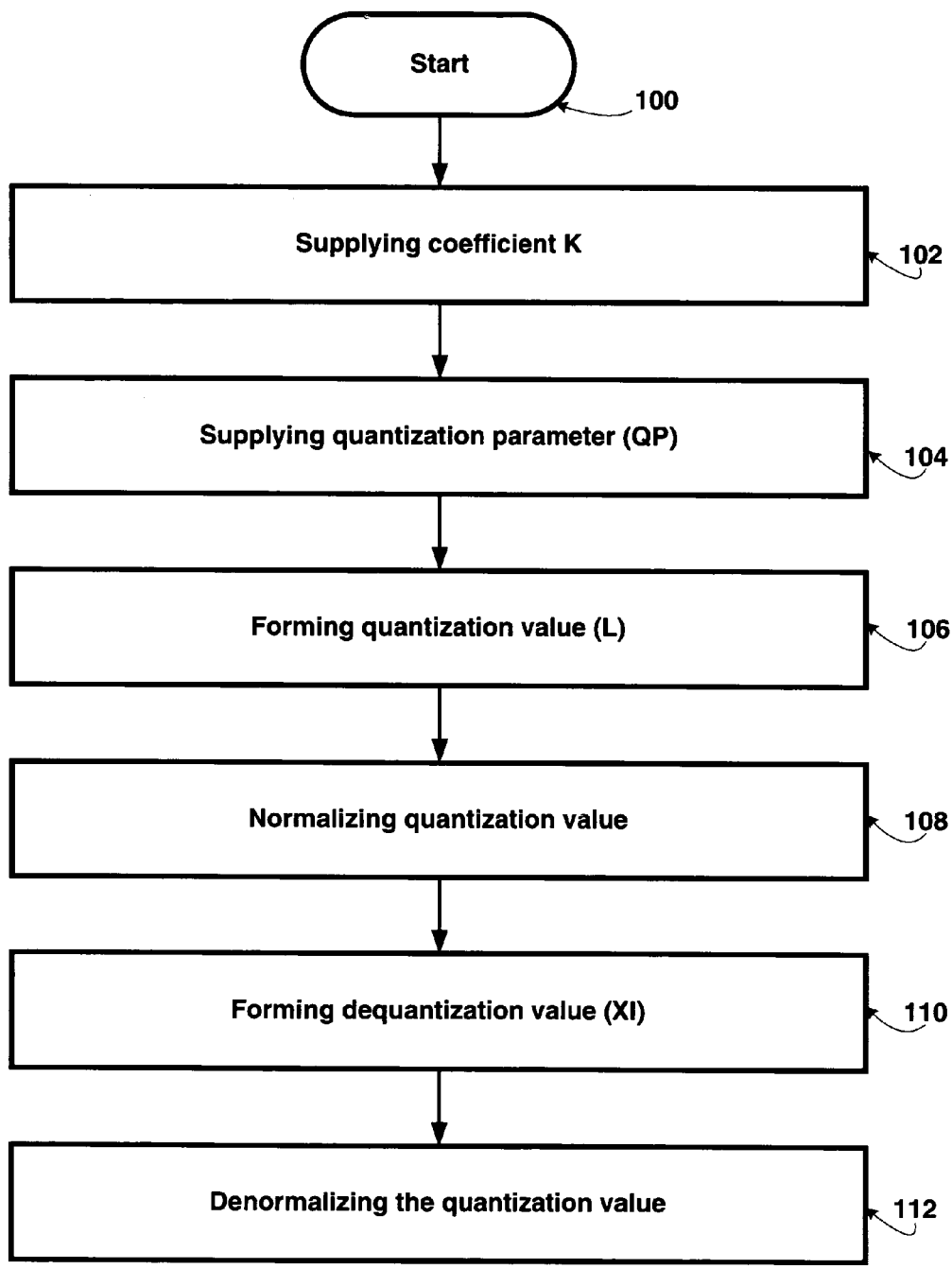
FIG. 1 is a flowchart illustrating the present invention method for the quantization of a coefficient.

The dynamic range requirements of the combined transform and quantization is reduced by factoring the quantization parameters A(QP) and B(QP) into a mantissa and exponent terms as shown in Equation 4. With this structure, only the precision due to the mantissa term needs to be preserved during calculation. The exponent term can be included in the final normalization shift. This is illustrated in the sample calculation Equation 5.

Equation 4 Structure of Quantization Parameters $$A_{proposed}(QP) = A_{mantissa}(QP) \cdot 2^{A_{exponent}(QP)}$$

$$B_{proposed}(QP) = B_{mantissa}(QP) \cdot 2^{B_{exponent}(QP)}$$

Equation 5 Reduced Bit_depth DCT_LUMA $$Y = T \cdot X$$

$$K = Y \cdot T^T$$

$$L = (A_{mantissa}(QP) \cdot K) / 2^{20 - A_{exponent}(QP)}$$

$$K' = T^T \cdot L$$

$$Y' = K' \cdot T$$

$$X' = (B_{mantissa}(QP) \cdot Y') / 2^{20 - B_{exponent}(QP)}$$

To illustrate the present invention, a set of quantization parameters is presented that reduce the dynamic range requirement of an H.26L decoder to 16-bit memory access. The memory access of the iDCT is reduced to 16 bits. Six pairs are defined (A, B) for QP=0–5, Table 3. Additional values are determined by recursion, Equation 6. The structure of these values makes it possible to generate new quantization values in addition to those specified.

TABLE 3

Quantization values 0–5 for TML

| QP | $A_{mantissa}$ | $A_{exponent}$ | $B_{mantissa}$ | $B_{exponent}$ | $A_{proposed}$ | $B_{proposed}$ |
|---|---|---|---|---|---|---|
| 0 | 5 | 7 | 235 | 4 | 640 | 3760 |
| 1 | 9 | 6 | 261 | 4 | 576 | 4176 |
| 2 | 127 | 2 | 37 | 7 | 508 | 4736 |
| 3 | 114 | 2 | 165 | 5 | 456 | 5280 |
| 4 | 25 | 4 | 47 | 7 | 400 | 6016 |
| 5 | 87 | 2 | 27 | 8 | 348 | 6912 |

Equation 6 Recursion Relations $$A_{mantissa}(QP+6) = A_{mantissa}(QP)$$

$$B_{mantissa}(QP+6) = B_{mantissa}(QP)$$

$$A_{exponent}(QP+6) = A_{exponent}(QP) - 1$$

$$B_{exponent}(QP+6) = B_{exponent}(QP) + 1$$

Using the defined parameters, the DCT calculations can be modified to reduce the dynamic range as shown in Equation 5. Note how only the mantissa values contribute to the growth of dynamic range. The exponent factors are incorporated into the final normalization and do not impact the dynamic range of intermediate results.

With these values and computational method, the dynamic range at the decoder is reduced so only 16-bit memory access is needed as seen in Table 4.

TABLE 4

Dynamic range with low-bit depth quantization (QP > 6)

| 8-bit | DCT_LUMA | iDCT_LUMA |
|---|---|---|
| Register | 28 | 24 |
| Memory | 21 | 16 |

Several refinements can be applied to the joint quantization/normalization procedure described above. The general technique of factoring the parameters into a mantissa and exponent forms the basis of these refinements.

The discussion above assumes all basis functions of the transform have an equal norm and are quantized identically. Some integer transforms have the property that different basis functions have different norms. The present invention technique has been generalized to support transforms having different norms by replacing the scalars A[qp] and B[qp] above by matrices A[qp][i][j] and B[qp][i][j]. These parameters are linked by a normalization relation of the form shown below, Equation 7, which is more general than the single relation shown in Equation 1.

Equation 7 Joint Quantization/Normalization of Matrices $$A[qp][i][j] \cdot B[qp][i][j] = N[i][j]'$$

Following the method previously described, each element of each matrix is factored into a mantissa and an exponent term as illustrated in the equations below, Equation 8.

Equation 8 Factorization of Matrix Parameters $$A[qp][i][j] = A_{mantissa}[qp][i][j] \cdot 2^{A_{exponent}[qp][i][j]}$$

$$B[qp][i][j] = B_{mantissa}[qp][i][j] \cdot 2^{B_{exponent}[qp][i][j]}$$

A large number of parameters are required to describe these quantization and dequantization parameters. Several structural relations can be used to reduce the number of free parameters. The quantizer growth is designed so that the values of A are halved after each period P at the same time the values of B are doubled maintaining the normalization relation. Additionally, the values of $A_{exponent}[qp][i][j]$ and $B_{exponent}[qp][i][j]$ are independent of i, j and qp in the range [0, P−1]. This structure is summarized by structural equations, Equation 9. With this structure there are only two parameters $A_{exponent}[0]$ and $B_{exponent}[0]$.

Equation 9 Structure of Exponent Terms $$A_{exponent}[qp][i][j] = A_{exponent}[0] - qp/P$$

$$B_{exponent}[qp][i][j] = B_{exponent}[0] + qp/P$$

A structure is also defined for the mantissa values. For each index pair (i,j), the mantissa values are periodic with period P. This is summarized by the structural equation, Equation 10. With this structure, there are P independent matrices for $A_{mantissa}$ and P independent matrices for $B_{mantissa}$ reducing memory requirements and adding structure to the calculations.

Equation 10 Structure of Mantissa Terms $$A_{mantissa}[qp][i][j] = A_{mantissa}[qp \% P][i][j]$$

$$B_{mantissa}[qp][i][j] = B_{mantissa}[qp \% P][i][j]$$

The inverse transform may include integer division that requires rounding. In cases of interest the division is by a power of 2. The rounding error is reduced by designing the dequantization factors to be multiples of the same power of 2, giving no remainder following division.

Dequantization using the mantissa values $B_{mantissa}[qp]$ gives dequantized values that are normalized differently depending upon qp. This must be compensated for following the inverse transform. A form of this calculation is shown in Equation 11.

Equation 11 Normalization of Inverse Transform I $$K[i][j] = B_{mantissa}[qp \% P][i][j] \cdot \text{Level}[i][j]$$

$$X = (T^{-1} \cdot K \cdot T)/2^{(N-qP/P)}$$

To eliminate the need for the inverse transform to compensate for this normalization difference, the dequantization operation is defined so that all dequantized values have the same normalization. The form of this calculation is shown in Equation 12.

Equation 12 Normalization of Inverse Transform II $$K[i][j] = B_{mantissa}[qp \% P][i][j] \cdot 2^{qp/P} \cdot \text{Level}[i][j]$$

$$X = (T^{-1} \cdot K \cdot T)/2^{N}$$

An example follows that illustrates the present invention use of quantization matrices. The forward and inverse transforms defined in Equation 13 need a quantization matrix rather than a single scalar quantization value. Sample quantization and dequantization parameters are given. Equation 14 and 16, together with related calculations, illustrate the use of this invention. This example uses a period P=6.

$$T_{forward} = \begin{pmatrix} 1 & 1 & 1 & 1 \\ 2 & 1 & -1 & -2 \\ 1 & -1 & -1 & 1 \\ 1 & -2 & 2 & -1 \end{pmatrix}$$

$$T_{reverse} = \begin{pmatrix} 2 & 2 & 2 & 1 \\ 2 & 1 & -2 & -2 \\ 2 & -2 & -2 & 2 \\ 2 & -1 & 2 & -1 \end{pmatrix}$$

Equation 13 transforms $$Q[m][i][j] = M_{m,0} \text{ for}(i, j) = \{(0, 0), (0, 2), (2, 0), (2, 2)\}$$
$$Q[m][i][j] = M_{m,0} \text{ for}(i, j) = \{(1, 1), (1, 3), (3, 1), (3, 3)\}$$
$$Q[m][i][j] = M_{m,0} \text{ otherwise}$$

$$M = \begin{bmatrix} 21844 & 8288 & 13108 \\ 18724 & 7625 & 11650 \\ 16384 & 6989 & 10486 \\ 14564 & 5992 & 9532 \\ 13107 & 5243 & 8066 \\ 11916 & 4660 & 7490 \end{bmatrix}$$

Equation 14 quantization parameters

-continued $R[m][i][j] = S_{m,0}$ for $(i, j) = \{(0, 0), (0, 2), (2, 0), (2, 2)\}$
$R[m][i][j] = S_{m,0}$ for $(i, j) = \{(1, 1), (1, 3), (3, 1), (3, 3)\}$
$R[m][i][j] = S_{m,0}$ otherwise $$S = \begin{bmatrix} 6 & 10 & 8 \\ 7 & 11 & 9 \\ 8 & 12 & 10 \\ 9 & 14 & 11 \\ 10 & 16 & 13 \\ 11 & 18 & 14 \end{bmatrix}$$

The description of the forward transformation and forward quantization, Equation 18, are given below assuming input is in X, quantization parameter QP.

Equation 17 Forward Transform $$K = T_{forward} \cdot X \cdot T_{forward}^T$$

Equation 18 Forward Quantization period=$QP/6$ phase=$QP-6\cdot$period

Level$[i][j]=(Q[\text{phase}][i][j]\cdot K[i][j])/2^{(17+period)}$

The description of dequantization, inverse transform, and normalization for this example is given below, Equation 19 and 20.

Equation 19 Dequantization period=$QP/6$ phase=$QP-6\cdot$period $K[i][j]=R[\text{phase}][i][j]\cdot \text{Level}[i][j]19 \ 2^{period}$ Equation 20 IDCT and Normalization $X' = T_{reverse} \cdot K \cdot T_{reverse}^T$ $X''[i][j]=X'[i][j]/2^7$ FIG. 1 is a flowchart illustrating the present invention method for the quantization of a coefficient. Although this method is depicted as a sequence of numbered steps for clarity, no order should be inferred from the numbering unless explicitly stated. It should be understood that some of these steps may be skipped, performed in parallel, or performed without the requirement of maintaining a strict order of sequence. The methods start at Step 100. Step 102 supplies a coefficient K. Step 104 supplies a quantization parameter (QP). Step 106 forms a quantization value (L) from the coefficient K using a mantissa portion (Am)(QP)) and an exponential portion ($x^{Ae(QP)}$). Typically, the exponential portion ($x^{Ae(QP)}$) includes x being the value 2.

In some aspects of the method, forming a quantization value (L) from the coefficient K using a mantissa portion (Am)(QP)) and an exponential portion ($x^{Ae(QP)}$) in Step 106 includes:

Equation 16 Dequantization parameters $L = K * A(QP) = K * Am(QP) * (2^{Ae(QP)})$.

Some aspects of the method include a further step. Step 108 normalizes the quantization value by $2^N$ as follows:

$$Ln = \frac{L}{2^N} = K * Am \frac{(QP)}{2^{(N-Ae(QP))}}.$$

In other aspects, forming a quantization value in Step 106 includes forming a set of recursive quantization factors with a period P, where $A(QP+P)=A(QP)/x$. Likewise, forming a set of recursive quantization factors includes forming recursive mantissa factors, where $Am(QP)=Am(QP \bmod P)$. Then, forming a set of recursive quantization factors includes forming recursive exponential factors, where $Ae(QP)=Ae(QP \bmod P)-QP/P$.

In some aspects, forming a quantization value includes forming a set of recursive quantization factors with a period P, where $A(QP+P)=A(QP)/2$. In other aspects, forming a set of recursive quantization factors includes forming recursive mantissa factors, where P=6. Likewise, forming a set of recursive quantization factors includes forming recursive exponential factors, where P=6.

In some aspects of the method, supplying a coefficient K in Step 102 includes supplying a coefficient matrix K[i][j]. Then, forming a quantization value (L) from the coefficient matrix K[i][j] using a mantissa portion (Am)(QP) and an exponential portion ($x^{Ae(QP)}$) in Step 106 includes forming a quantization value matrix (L[i][j]) using a mantissa portion matrix (Am(QP)[i][j]) and an exponential portion matrix ($x^{Ae(QP)[i][j]}$). Likewise, forming a quantization value matrix (L[i][j]) using a mantissa portion matrix (Am(QP)[i][j]) and an exponential portion matrix ($x^{Ae(QP)[i][j]}$) includes, for each particular value of QP, every element in the exponential portion matrix being the same value. Typically, every element in the exponential portion matrix is the same value for a period (P) of QP values, where $Ae(QP)=Ae(P*(QP/P))$.

Some aspects of the method include a further step. Step 110 forms a dequantization value (X1) from the quantization value, using a mantissa portion (Bm)(QP)) and an exponential portion ($x^{Be(QP)}$). Again, the exponential portion ($x^{Be}$ (QP)) typically includes x being the value 2.

In some aspects of the method, forming a dequantization value (X1) from the quantization value, using a mantissa portion (Bm)(QP)) and an exponential portion ($2^{Be(QP)}$) includes:

$$X1 = L*B(QP) = L*Bm(QP)*(2^{Be(QP)}).$$

Other aspects of the method include a further step, Step 112, of denormalizing the quantization value by $2^N$ as follows:

$$X1d = \frac{X1}{2^N} = X1*Bm\frac{(QP)}{2^N}.$$

In some aspects, forming a dequantization value in Step 110 includes forming a set of recursive dequantization factors with a period P, where B(QP+P)=x*B(QP). Then, forming a set of recursive dequantization factors includes forming recursive mantissa factors, where Bm(QP)=Bm(QP mod P). Further, forming a set of recursive dequantization factors includes forming recursive exponential factors, where Be(QP)=Be(QP mod P)+QP/P.

In some aspects, forming a set of recursive quantization factors with a period P includes the value of x being equal to 2, and forming recursive mantissa factors includes the value of P being equal to 6. Then, forming a set of recursive dequantization factors includes forming recursive exponential factors, where Be(QP)=Be(QP mod P)+QP/P.

In some aspects of the method, forming a dequantization value (X1), from the quantization value, using a mantissa portion (Bm)(QP)) and an exponential portion ($x^{Be(QP)}$) in Step 110 includes forming a dequantization value matrix (X1[i][j]) using a mantissa portion matrix (Bm(QP)[i][j]) and an exponential portion matrix ($x^{Be(QP)[i][j]}$). Likewise, forming a dequantization value matrix (X1[i][j]) using a mantissa portion matrix (Bm(QP)[i][j]) and an exponential portion matrix ($x^{Be(QP)[i][j]}$) includes, for each particular value of QP, every element in the exponential portion matrix being the same value. In some aspects, every element in the exponential portion matrix is the same value for a period (P) of QP values, where Be(QP)=Be(P*(QP/P)).

Another aspect of the invention includes a method for the dequantization of a coefficient. However, the process is essentially the same as Steps 110 and 112 above, and is not repeated in the interest of brevity.

A method for the quantization of a coefficient has been presented. An example is given illustrating a combined dequantization and normalization procedure applied to the H.26L video coding standard with a goal of reducing the bit-depth required at the decoder to 16 bits. The present invention concepts can also be used to meet other design goals within H.26L. In general, this invention has application to the combination of normalization and quantization calculations. Other variations and embodiments of the invention will occur to those skilled in the art.

Embodiments of the present invention may be implemented as hardware, firmware, software and other implementations. Some embodiments may be implemented on general purpose computing devices or on computing devices specifically designed for implementation of these embodiments. Some embodiments may be stored in memory as a means of storing the embodiment or for the purpose of executing the embodiment on a computing device.

Figure 2:
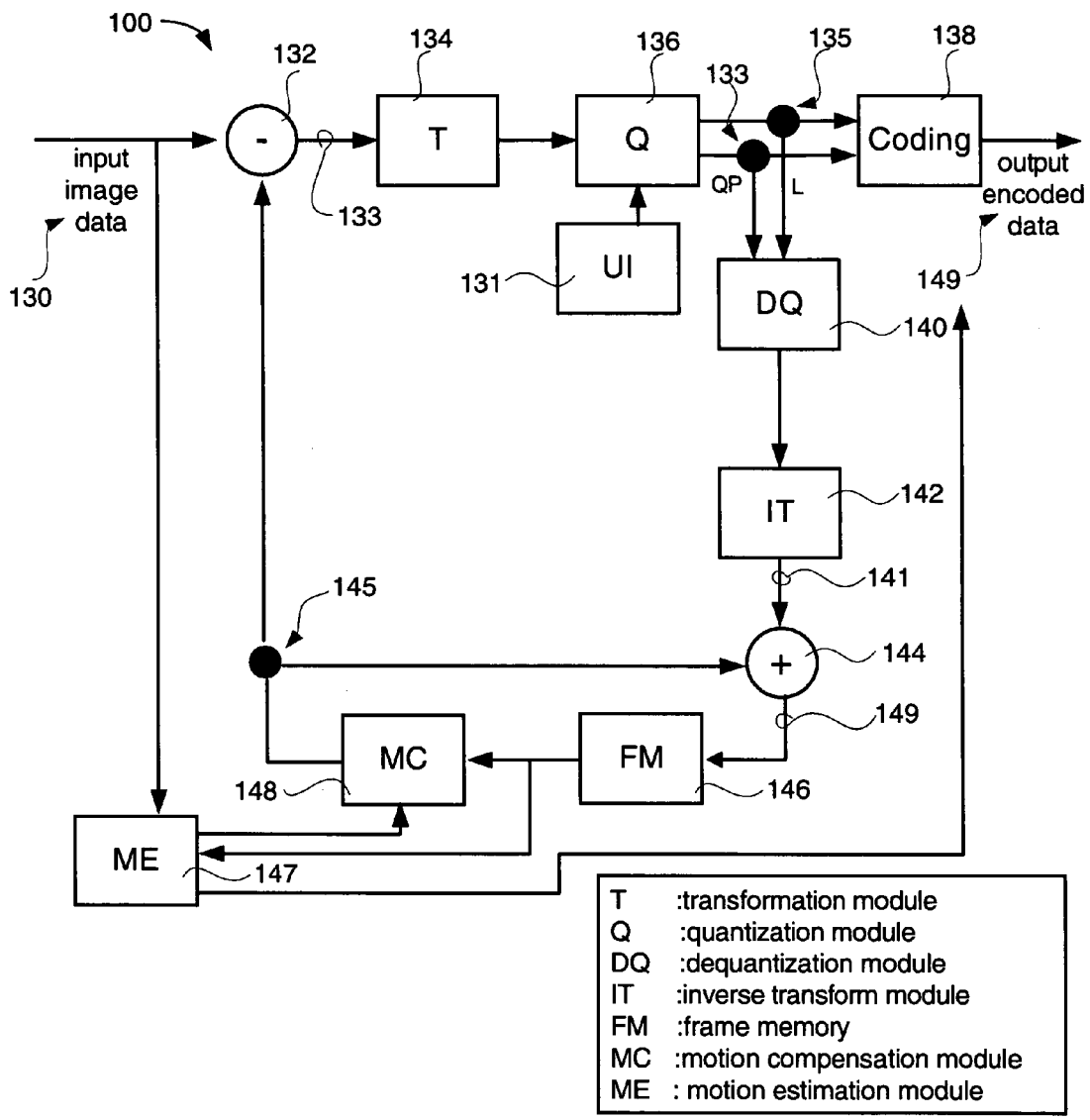
FIG. 2 is a diagram showing embodiments of the present invention comprising systems and methods for video encoding wherein a quantization parameter may be established based on user inputs.

Some embodiments of the present invention comprise systems and methods for video encoding, as shown in FIG. 2. In these embodiments, image data 130 is subtracted from 132 with data representing prior video frames 145 resulting in a differential image 133, which is sent to a transform module 134. Transform module 134 may use DCT or other transform methods to transform the image. Generally, the result of the transform process will be coefficients (K), which are then sent to a quantization module 136 for quantization.

Quantization module 136 may have other inputs, such as user inputs 131 for establishing quantization parameters (QPs) and for other input. Quantization module 136 may use the transformation coefficients and the quantization parameters to determine quantization levels (L) in the video image. Quantization module 136 may use methods employing a mantissa portion and an exponential portion, however, other quantization methods may also be employed in the quantization modules 136 of embodiments of the present invention. These quantization levels 135 and quantization parameters 133 are output to a coding module 138 as well as a dequantization module (DQ) 140.

Output to the coding module 138 is encoded and transmitted outside the encoder for immediate decoding or storage. Coding module 138 may use variable length coding (VLC) in its coding processes. Coding module 138 may use arithmetic coding in its coding process.

Output from quantization module 136 is also received at dequantization module 140 to begin reconstruction of the image. This is done to keep an accurate accounting of prior frames. Dequantization module 140 performs a process with essentially the reverse effect as quantization module 136. Quantization levels or values (L) are dequantized yielding transform coefficients. Dequantization modules 140 may use methods employing a mantissa portion and an exponential portion as described herein.

The transform coefficients output from dequantization module 140 are sent to an inverse transformation (IT) module 142 where they are inverse transformed to a differential image 141. This differential image 141 is then combined with data from prior image frames 145 to form a video frame 149 that may be input to a frame memory 146 for reference to succeeding frames.

Video frame 149 may also serve as input to a motion estimation module 147, which also receives input image data 130. These inputs may be used to predict image similarities and help compress image data. Output from motion estimation module 147 is sent to motion compensation module 148 and combined with output data from coding module 138, which is sent out for later decoding and eventual image viewing.

Motion compensation module 148 uses the predicted image data to reduce frame data requirements; its output is subtracted from input image data 130.

Figure 3:
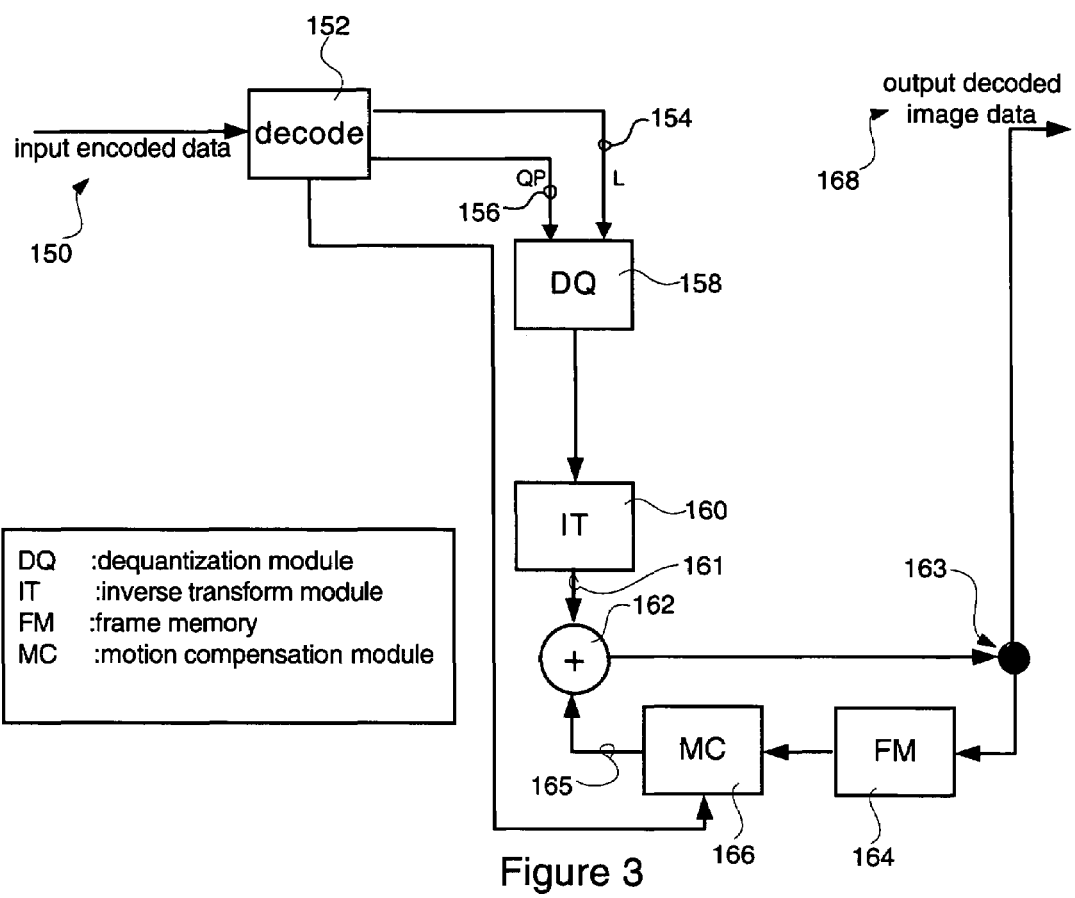
FIG. 3 is a diagram showing embodiments of the present invention comprising systems and methods for video decoding.

Some embodiments of the present invention comprise systems and methods for video decoding, as shown in FIG. 3. A decoder of embodiments of the present invention may receive encoded image data 150 to a decoder module 152. Encoded image data 150 may comprise data that has been encoded by an encoder 100 such as that described with reference to FIG. 2.

Decoder module 152 may employ variable length decoding methods if they were used in the encoding process. Other decoding methods may also be used as dictated by the type of encoded data 150. Decoding module 152 performs essentially the reverse process as coding module 138. Output from decoding module 152 may comprise quantization parameters 156 and quantization values 154. Other output may comprise motion estimation data and image prediction data that may be sent directly to a motion compensation module 166.

Typically, quantization parameters 156 and quantization values 154 are output to a dequantization module 158, where quantization values are converted back to transform coefficients. These coefficients are then sent to an inverse transformation module 160 for conversion back to spatial domain image data 161.

The motion compensation unit 166 uses motion vector data and the frame memory 164 to construct a reference image 165.

Image data 161 represents a differential image that must be combined 162 with prior image data 165 to form a video frame 163. This video frame 163 is output 168 for further processing, display or other purposes and may be stored in frame memory 164 and used for reference with subsequent frames.

Figure 4:
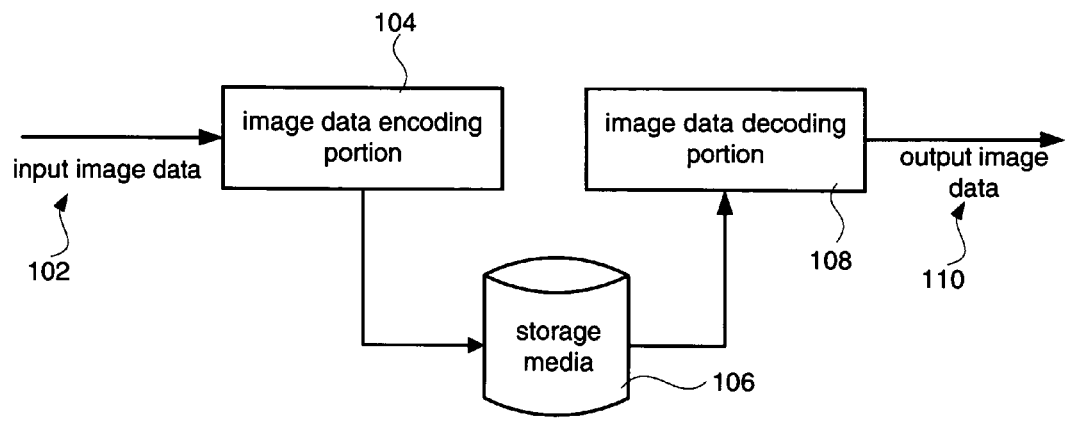
FIG. 4 is diagram showing embodiments of the present invention comprising storing encoder output on a computer-readable storage media.

In some embodiments of the present invention, as illustrated in FIG. 4, image data 102 may be sent to an encoder or encoding portion 104 for the various transformation, quantization, encoding and other procedures typical of video encoding as described above for some embodiments of the present invention. Output from the encoder may then be stored on any computer-readable storage media 106. Storage media 106 may act as a short-term buffer or as a long-term storage device.

When desired, encoded video data may be read from storage media 106 and decoded by a decoder or decoding portion 108 for output 110 to a display or other device.

Figure 5:
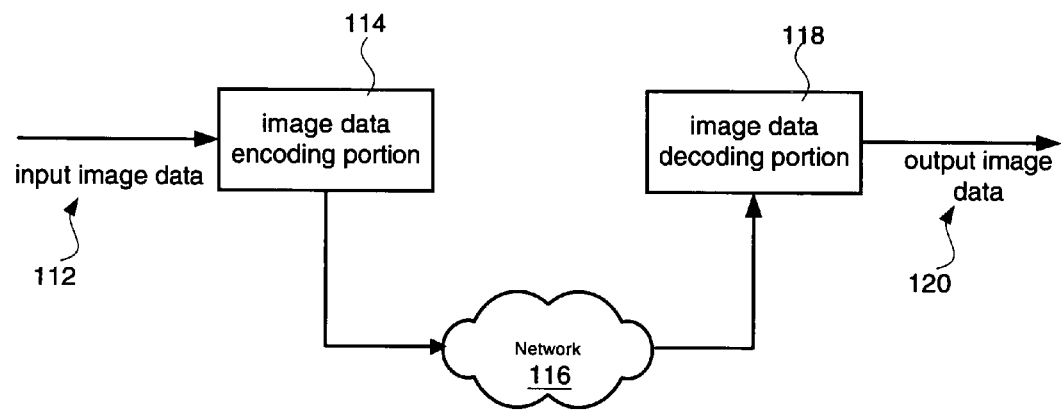
FIG. 5 is a diagram showing embodiments of the present invention comprising sending encoder output over a network.

In some embodiments of the present invention, as illustrated in FIG. 5, image data 112 may be sent to an encoder or encoding portion 114 for the various transformation, quantization, encoding and other procedures typical of video encoding as described above for some embodiments of the present invention. Output from the encoder may then be sent over a network, such as a LAN, WAN or the Internet 116. A storage device such as storage media 106 may be part of a network. Encoded video data may be received and decoded by a decoder or decoding portion 118, which also communicates with network 116. Decoder 118 may then decode the data for local consumption 120.

Figure 6:
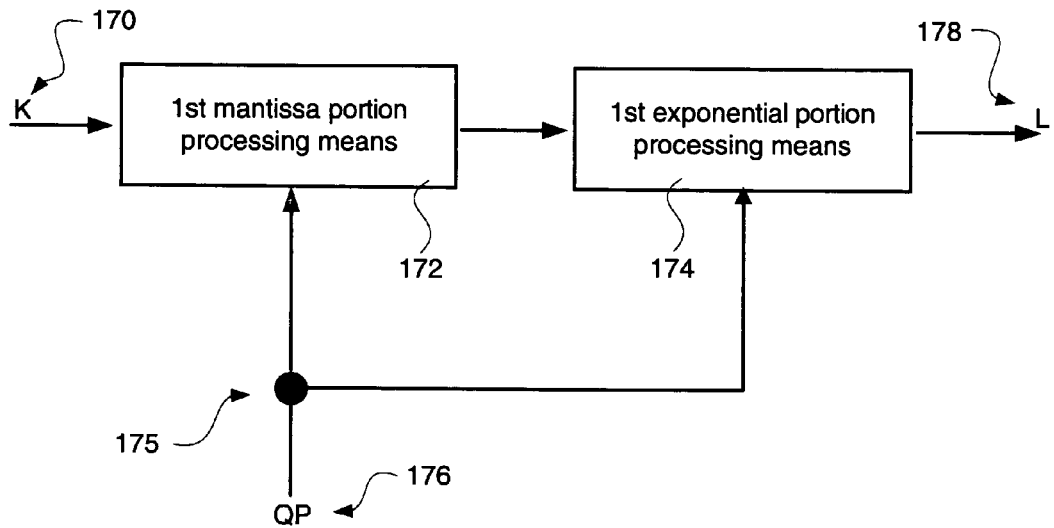
FIG. 6 is a diagram showing embodiments of quantization methods and apparatuses of the present invention comprising a first mantissa portion processing means and a first exponential portion processing means.

In some embodiments of the present invention, as illustrated in FIG. 6, a quantization method or apparatus comprises a mantissa portion 172 and an exponential portion 174. Quantization parameters 176 are input to both portions 172 & 174. A coefficient K 170 is input to the mantissa portion 172 where it is modified using the quantization parameter and other values as explained above. The result of this operation is combined with the result produced in the exponential portion using the quantization parameter thereby producing a quantization level or value L 178.

Figure 7:
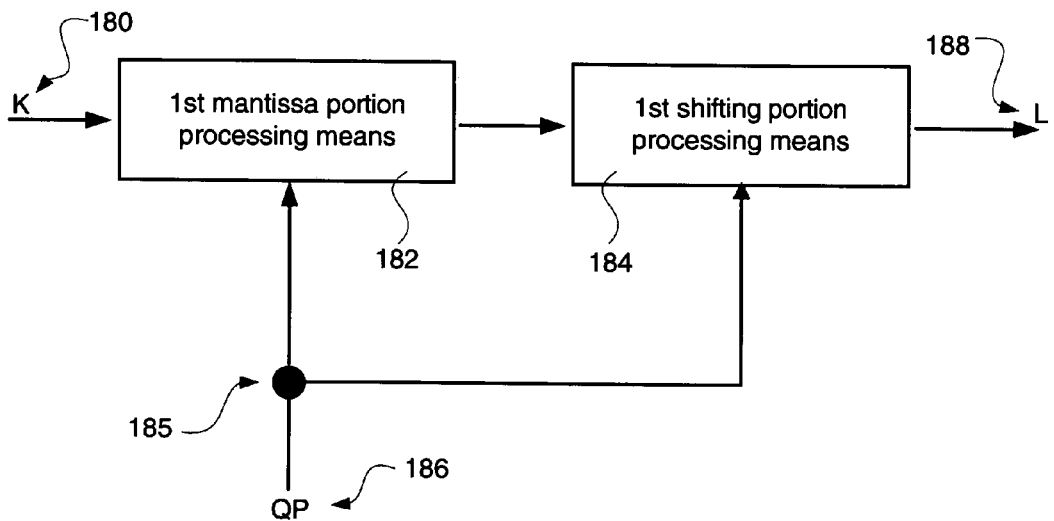
FIG. 7 is a diagram showing embodiments of quantization methods and apparatuses of the present invention comprising a first mantissa portion processing means and a first shifting portion processing means.

In some embodiments of the present invention, as illustrated in FIG. 7, a quantization method or apparatus comprises a mantissa portion 182 and a shifting portion 184. Quantization parameters 186 are input to both portions 182 & 184. A coefficient, K 180 is input to the mantissa portion 182 where it is modified using the quantization parameter and other values as explained above. The result of this operation is further processed in the shifting portion using the quantization parameter thereby producing a quantization level or value, L 188.

Figure 8:
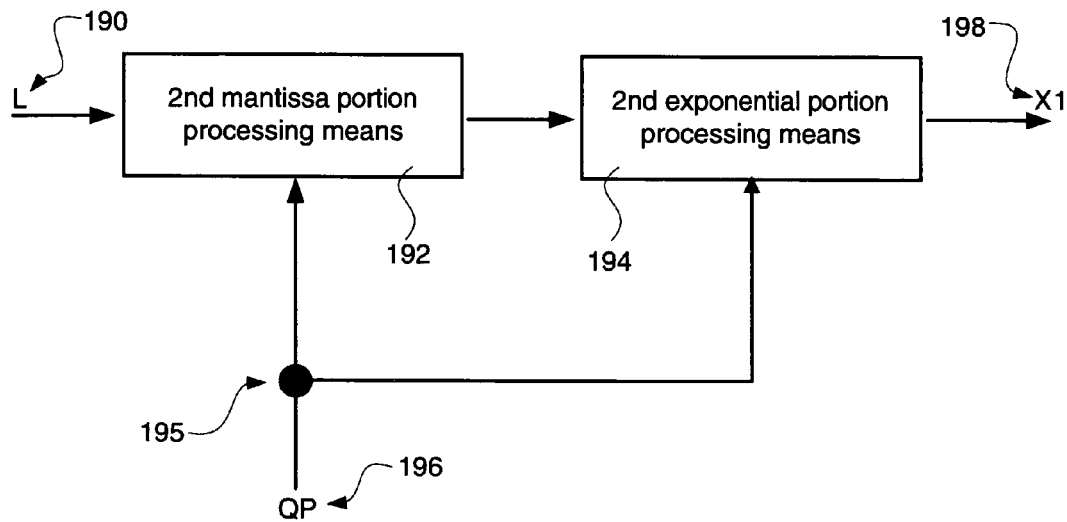
FIG. 8 is a diagram showing embodiments of dequantization methods and apparatuses of the present invention comprising a second mantissa portion processing means and a second exponential portion processing means.

Some embodiments of the present invention, as illustrated in FIG. 8, comprise a dequantization method or apparatus with a mantissa portion 192 and an exponential portion 194. Quantization parameters 196 are input to both portions 192 & 194. A quantization value, L 190 is input to the mantissa portion 192 where it is modified using the quantization parameter and other values as explained above. The result of this operation is further processed in the exponential portion using the quantization parameter thereby producing a coefficient, X1 198.

Figure 9:
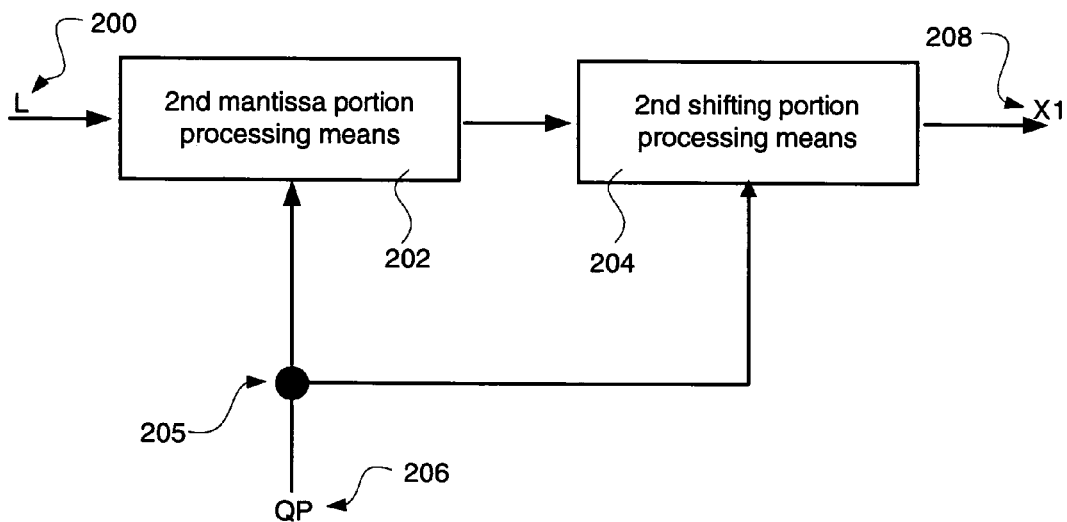
FIG. 9 is a diagram showing embodiments of dequantization methods and apparatuses of the present invention comprising a second mantissa portion processing means and a second shifting portion processing means.

Some embodiments of the present invention, as illustrated in FIG. 9, comprise a dequantization method or apparatus with a mantissa portion 202 and a shifting portion 204. Quantization parameters 206 are input to both portions 202 & 204. A quantization value, L 200 is input to the mantissa portion 202 where it is modified using the quantization parameter and other values as explained above. The result of this operation is further processed in the exponential portion using the quantization parameter thereby producing a coefficient, X1 208.

Some embodiments of the present invention may be stored on computer-readable media such as magnetic media, optical media, and other media as well as combinations of media. Some embodiments may also be transmitted as signals across networks and communication media. These transmissions and storage actions may take place as part of operation of embodiments of the present invention or as a way of transmitting the embodiment to a destination.

Figure 10:
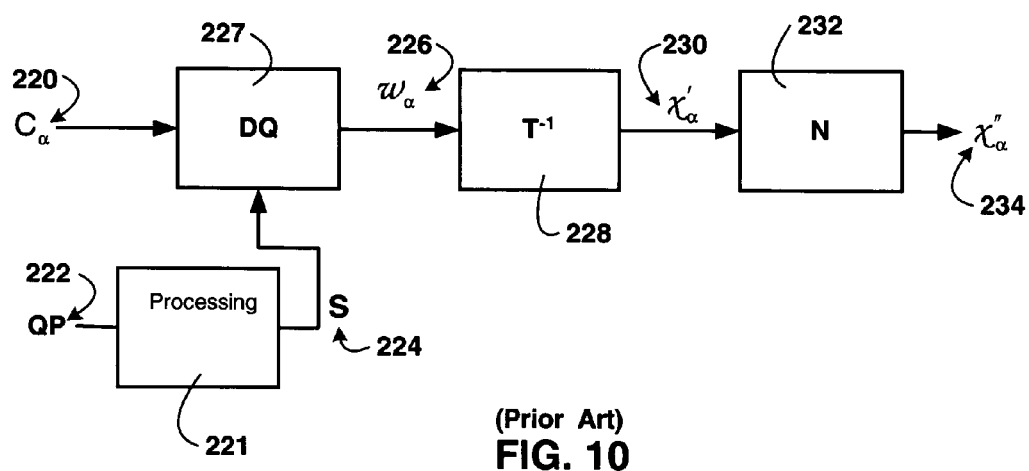
FIG. 10 is diagram showing prior art methods comprising dequantization, inverse transformation, and normalization (Prior Art)

Typical methods of dequantization, inverse transformation, and normalization may be expressed mathematically in equation form. These methods, as illustrated in FIG. 10, may begin with input in the form of an array of quantized coefficient levels $c_\alpha$ 220, and a quantization parameter QP 222. A dequantization scaling value $S^{QP}$ 224 is then calculated 221 using the quantization parameter QP 222. Quantized coefficient levels 220 are scaled 227 by $S^{QP}$ 224 to give transform coefficients $w_\alpha$ 226 according to Equation 21. These transform coefficients 226 are then inverse transformed 228 to compute scaled samples $x'_\alpha$ 230 as shown in Equation 22. The scaled samples 230 may then be normalized 232 to give reconstructed samples, $x''_\alpha$ 234 according to Equation 23.

$$w_\alpha = c_\alpha \cdot S^{QP} \qquad \text{Equation 21}$$

$$x'_\alpha = \sum_\beta T^{-1}_{\alpha\beta} \cdot w_\beta \qquad \text{Equation 22}$$

$$x''_\alpha 32\ (x'_\alpha + f) >> M \qquad \text{Equation 23}$$

Figure 11:
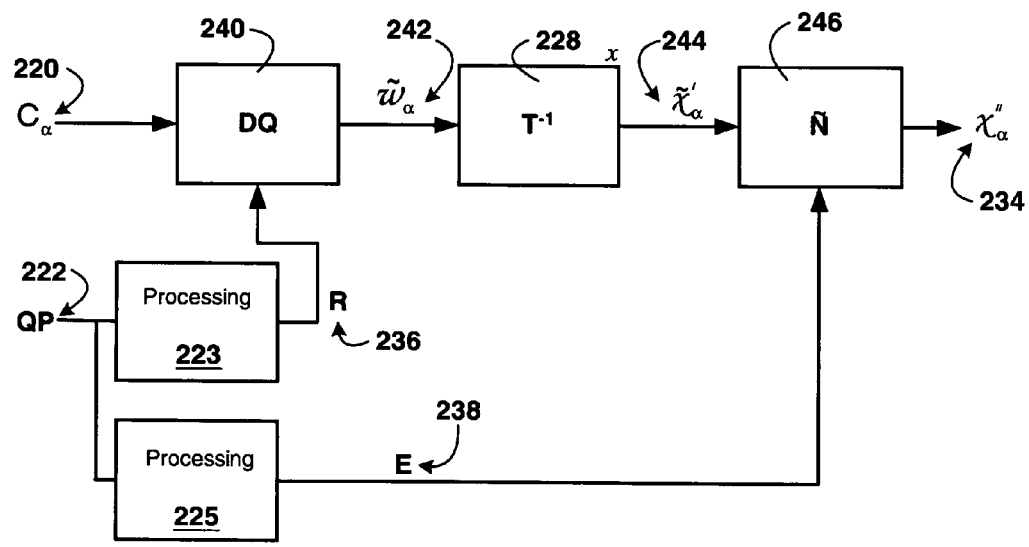
FIG. 11 is a diagram showing embodiments of the present invention comprising factorization of an equivalent of a dequantization scaling factor.

In embodiments of the present invention, a reduction in bit depth for inverse transformation calculations is achieved. The processes of these embodiments, illustrated in FIG. 11, begin with input in the form of an array of quantized coefficient levels $c_\alpha$ 220, and a quantization parameter QP 222 similar to typical prior art methods. However, in these embodiments, the equivalent of a dequantization scaling factor $S^{QP}$ is factored 223 & 225 into a mantissa portion $R^{QP}$ 236 and an exponential portion $E^{QP}$ 238. The mantissa portion 236 is used during dequantization 240 to calculate the reconstructed transform coefficients ($\tilde{w}_\alpha$) 242, which are used in the inverse transformation process 228 to calculate scaled samples ($\tilde{x}'_\alpha$) 244. These scaled samples may then be normalized using the exponential portion 238 according to Equation 26, thereby yielding reconstructed samples ($x''_\alpha$) 234. Using these methods, the values of $\tilde{w}_\alpha$ and $\tilde{x}'_\alpha$ require $E^{QP}$ fewer bits for representation than the corresponding values $w_\alpha$ and $x'_\alpha$. This factorization enables mathematically equivalent calculation of the reconstructed samples using lower intermediate precision as shown in Equations 24–26.

$$\tilde{w}_\alpha = c_\alpha \cdot R^{QP} \qquad \text{Equation 24}$$

$$\tilde{x}'_\alpha = \sum_\beta T^{-1}_{\alpha\beta} \cdot \tilde{w}_\beta \qquad \text{Equation 25}$$

$$x''_\alpha = [\tilde{x}'_\alpha + (f << E^{QP})] >> (M-E^{QP}) \qquad \text{Equation 26}$$

Figure 12:
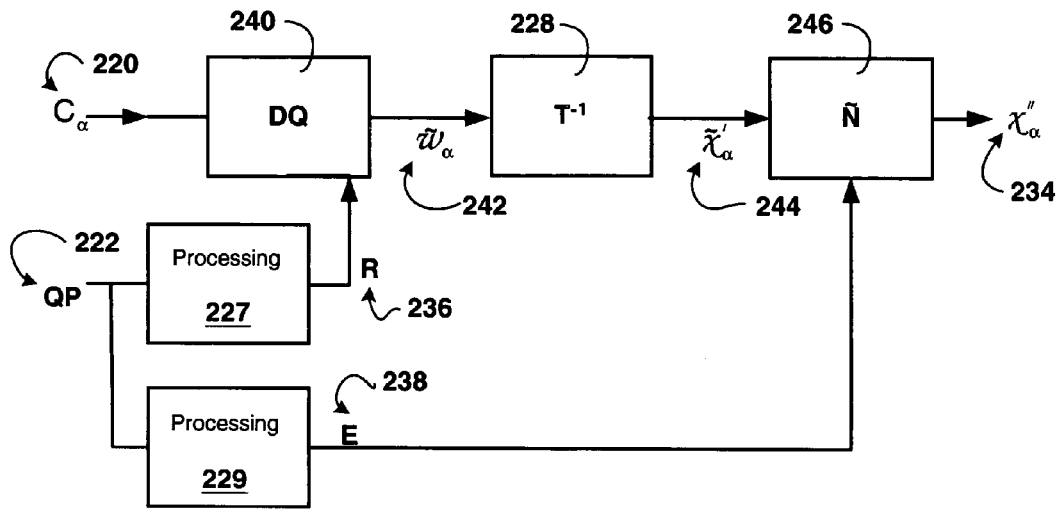
FIG. 12 is a diagram showing embodiments of the present invention comprising factorization thereby achieving a reduction in bit depth for inverse transformation calculations and reduce memory requirements for dequantization parameter storage.

In embodiments of the present invention, a reduction in bit depth for inverse transformation calculations is achieved together with a reduction in memory needed to store dequantization parameters. The processes of these embodiments, illustrated in FIG. 12, begin with input in the form of an array of quantized coefficient levels $c_\alpha$ 220, a quantization parameter QP 222 similar to typical prior art methods. However, in these embodiments, an additional parameter P is used and the equivalent of a dequantization scaling factor $S^{QP}$ is factored 227 & 229 into a mantissa portion $R^{QP}$ 236 and an exponential portion $E^{QP}$ 238. The mantissa portion, $R^{QP}$ 236, doubles with each increment of QP by P. The exponential portion $E^{QP}$ 238 is periodic with period P. The mantissa portion 236 is used during dequantization 240 to calculate the reconstructed transform coefficients ($\tilde{w}_\alpha$) 242, which are used in the inverse transformation process 228 to calculate scaled samples ($\tilde{x}'_\alpha$) 244. These scaled samples may then be normalized using the exponential portion 238 according to Equation 28, thereby yielding reconstructed samples, $x''_\alpha$ 234. Using these methods, the values of $\tilde{w}_\alpha$ and $\tilde{x}'_\alpha$ require $E^{QP}$ fewer bits for representation. This factorization enables mathematically equivalent calculation of the reconstructed samples using lower intermediate precision as shown in Equations 25, 27 & 28. Values of R and E need only be stored for QP in one period [1, P] reducing the memory requirements.

$$\tilde{w}_\alpha = c_\alpha \cdot R^{QP \, \% \, P} >> (QP/P) \qquad \text{Equation 27}$$

$$x''_\alpha = [\tilde{x}'_\alpha + (f << E^{QP\&P})] >> (M-E^{QP\&P}) \qquad \text{Equation 28}$$

Figure 13:
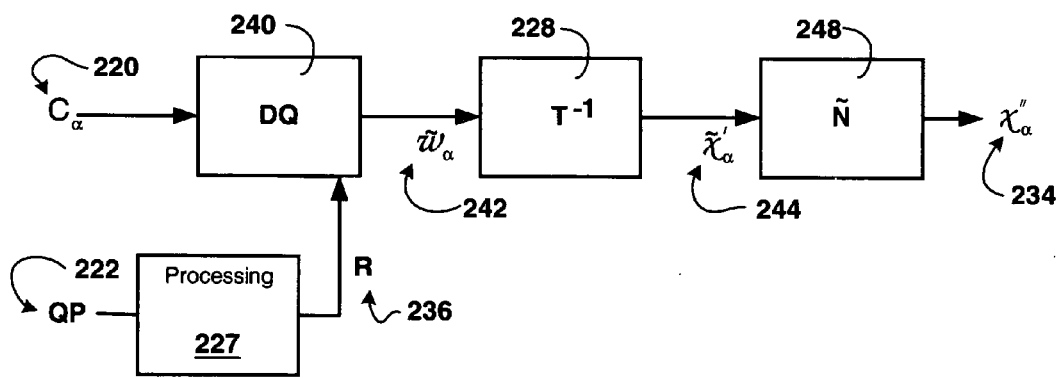
FIG. 13 is a diagram showing embodiments of the present invention comprising a normalization process independent of quantization parameter (QP)

In embodiments of the present invention, a reduction in bit depth for inverse transformation calculations is achieved together with a reduction in memory needed to store dequantization parameters. Additionally, the normalization process is independent of QP. This eliminates the need to communicate an exponential value for use in the normalization process. In these embodiments, the exponential portion, previously described as $E^{QP}$ is held constant and incorporated into normalization 248 thereby negating the need to transmit the value as is done in previously described embodiments. The processes of these embodiments, illustrated in FIG. 13, begin with input in the form of an array of quantized coefficient levels $c_\alpha$ 220, a quantization parameter QP 222 similar to typical prior art methods. Some of these embodiments implement the parameter P as described above. In these embodiments, the equivalent of a dequantization scaling factor $S^{QP}$ is factored 227 & 229 into a mantissa portion $R^{QP}$ 236 and a constant exponential portion $E^{QP}$ that is incorporated into normalization 248. The mantissa portion, $R^{QP}$ 236, may double with each increment of QP by P as previously described. The exponential portion $E^{QP}$ 238 is constant. The mantissa portion 236 is used during dequantization 240 to calculate the reconstructed transform coefficients ($\tilde{w}_\alpha$) 242, which are used in the inverse transformation process 228 to calculate scaled samples ($\tilde{x}'_\alpha$) 244. These scaled samples may then be normalized using the constant exponential portion that is incorporated into normalization 248 according to Equation 27, thereby yielding reconstructed samples, $x''_\alpha$ 234. Using these methods, the values of $\tilde{w}_\alpha$ and $\tilde{x}'_\alpha$ require $E^{QP}$ fewer bits for representation. This factorization enables mathematically equivalent calculation of the reconstructed samples using lower intermediate precision as shown for other embodiments above in Equations 25, 27 & 29. For embodiments that employ periodic values related to the parameter P, values of R need only be stored for QP in one period [1, P] reducing the memory requirements. The constant value for E simplifies the process by eliminating the need to transmit E to the normalization process 248.

$$x''_\alpha = (\tilde{x}'_\alpha + 2^{\tilde{z}}) >> \tilde{M} \qquad \text{Equation 29}$$

In further embodiments of the present invention, a reduction in bit depth for inverse transformation calculations is achieved together with a reduction in memory needed to store dequantization parameters and the normalization process is independent of QP thereby eliminating the need to communicate an exponential value for use in the normalization process. These embodiments also express the quantization scaling factor mantissa portion as a matrix. This matrix format allows frequency dependent quantization, which allows the processes of these embodiments to be used in coding schemes that comprise frequency-dependent transformation.

Figure 14:
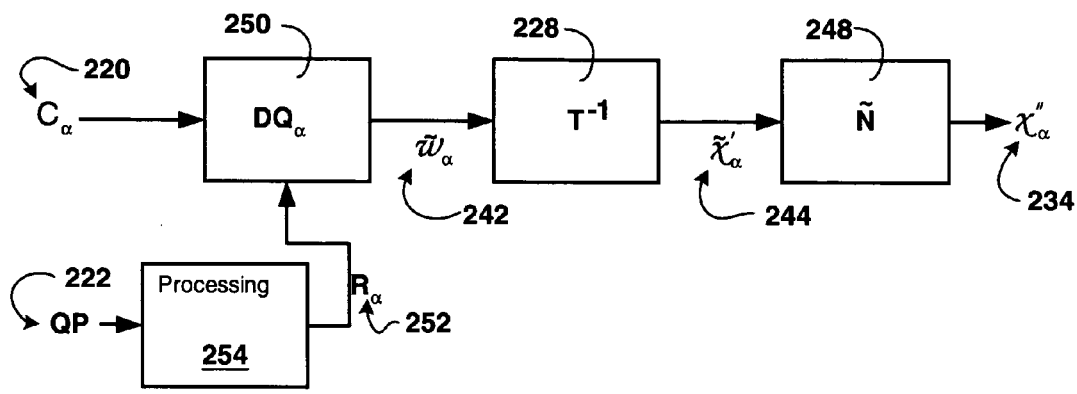
FIG. 14 is diagram showing embodiments of the present invention comprising frequency dependent quantization.

In these embodiments, the exponential portion, previously described as $E^{QP}$ may be held constant and incorporated into normalization 248 as previously explained. The processes of these embodiments, illustrated in FIG. 14, begin with input in the form of an array of quantized coefficient levels $c_\alpha$ 220, and a quantization parameter QP 222 similar other methods. Some of these embodiments may implement the parameter P as described above.

In these embodiments, the equivalent of a dequantization scaling factor $S_\alpha^{QP}$ is factored 254 into a mantissa portion $R_\alpha^{QP}$ 252 and a constant exponential portion $E^{QP}$ that is incorporated into normalization 248. The mantissa portion, $R_\alpha^{QP}$ 252, may double with each increment of QP by P as previously described. The exponential portion $E^{QP}$ is constant. The mantissa portion 252 is used during dequantization 250 to calculate the reconstructed transform coefficients ($\tilde{w}_\alpha$) 242, which are used in the inverse transformation process 228 to calculate scaled samples ($\tilde{x}'_\alpha$) 244. These scaled samples may then be normalized using the constant exponential portion that is incorporated into normalization 248 according to Equation 27, thereby yielding reconstructed samples, $x''_\alpha$ 234. Using these methods, the values of $\tilde{w}_\alpha$ and $\tilde{x}'_\alpha$ require $E^{QP}$ fewer bits for representation. This factorization enables mathematically equivalent calculation of the reconstructed samples using lower intermediate precision as described above and in Equations 25, 27 & 29. In these embodiments the dequantization scaling factor portion is expressed as a matrix. This format is expressed in Equation 30 with the subscript α.

$$\tilde{w}_\alpha = c_\alpha \cdot R_\alpha^{QP \, \% \, P} >> (QP/P) \qquad \text{Equation 30}$$

Figure 15:
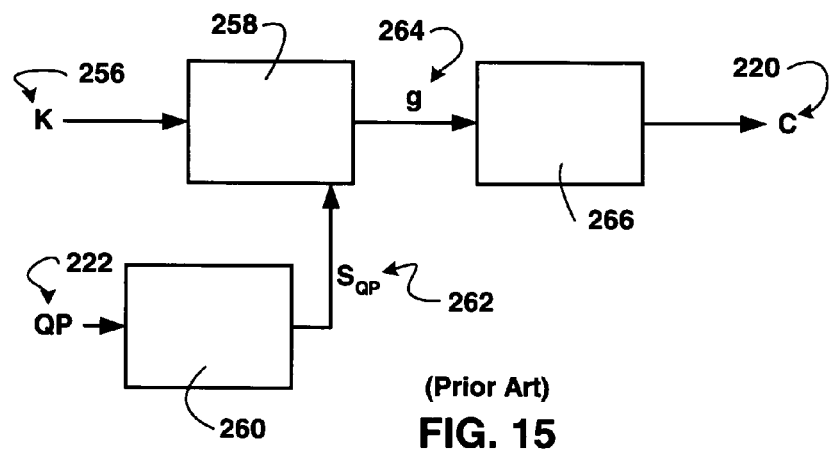
FIG. 15 is a diagram showing prior art methods comprising quantization (Prior Art)

Typical methods of quantization may be expressed mathematically in equation form. These methods, as illustrated in FIG. 15, may begin with input in the form of a coefficient (k) 256 and a quantization parameter 222. The coefficient 256 is multiplied by a quantization factor 262 to give the value g 264 according to Equation 31. The value g 264 is normalized 266 to give the quantized coefficient level c 220 according to Equation 32.

$$g = k \cdot S^{QP} \qquad \text{Equation 31}$$

$$c = g >> M \qquad \text{Equation 32}$$

Figure 16:
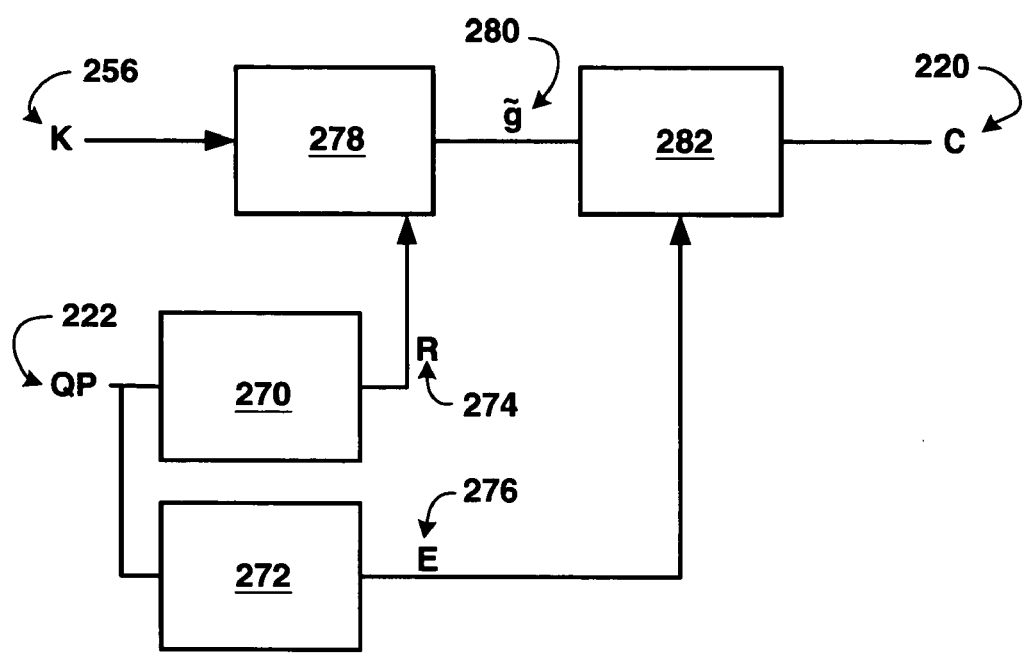
FIG. 16 is a diagram showing embodiments of the present invention comprising factorization of an equivalent of a quantization scaling factor.

In embodiments of the present invention, a reduction in bit depth for quantization calculations is achieved together with a reduction in memory needed to store quantization parameters. The processes of these embodiments, illustrated in FIG. 16, may begin with input in the form of coefficient (k) 256 and a quantization parameter QP 222. However, in these embodiments, an additional parameter P is used in processing. The equivalent of a quantization scaling factor $S^{QP}$ is factored into a mantissa portion $R^{QP}$ 274 and an exponential portion $E^{QP}$ 276. The mantissa portion $R^{QP}$ 274 is periodic with period P. The exponential portion 276 decreases by one for each increment of QP by P. The mantissa portion 274 is used during quantization 278 to calculate the scaled transform coefficient ($\tilde{g}$) 280 according to Equation 33. The scaled transform coefficient may then be normalized 282 using the exponential portion 276 according to Equation 34, thereby yielding the quantized coefficient level (c) 220. Using these methods, the value of $\tilde{g}$ 280 requires $E^{QP}$ fewer bits for representation than a corresponding value g 264 generated through known methods. Values of R 274 and E 276 need only be stored for QP in one period [1, P] reducing the memory requirements. This factorization enables mathematically equivalent calculation of the reconstructed samples using lower intermediate precision as shown in Equations 33 & 34.

$$\tilde{g}=k \cdot R^{QP \% P} \qquad \text{Equation 33}$$

$$c=\tilde{g}>>(M-E^{QP}) \qquad \text{Equation 34}$$

I claim:

1. A method for reconstruction of a compressed image signal by dequantization and inverse transformation of an image difference signal, said method comprising:
   - receiving a plurality of quantized coefficient levels that define an image;
   - receiving a quantization parameter (QP);
   - determining a periodic mantissa portion matrix depending on QP % P using a constant parameter (P);
   - determining an exponential portion depending on QP/P;
   - computing reconstructed transform coefficients from said plurality of quantized coefficient levels, said periodic mantissa portion and said exponential portion;
   - performing an inverse transformation on said reconstructed transform coefficients thereby yielding scaled samples;
   - computing reconstructed samples, by normalizing the scaled samples using a constant normalization factor (M).

2. The method of claim 1 wherein P=6 and M=6 and wherein said computing a reconstructed transform coefficient comprises using a formula equivalent to $\tilde{w}_\alpha=[c_\alpha \cdot R_\alpha^{QP \% P}]<<(QP/P)$ and said computing reconstructed samples comprises using a formula equivalent to $x''_\alpha=(\tilde{x}'_\alpha+(1<<(M-1)))>>M$.

3. A method as described in claim 1 wherein said constant parameter (P) is equal to 6.

4. A method as described in claim 1 wherein said constant normalization factor (M) is equal to 6.

5. A method as described in claim 1 wherein said constant parameter (P) is equal to 6 and said constant normalization factor (M) is equal to 6.

6. A method for reconstruction of a compressed image signal by dequantization and inverse transformation of an image difference signal, said method comprising:
   - receiving a plurality of quantized coefficient levels ($c_\alpha$) that define an image;
   - receiving a quantization parameter (QP);
   - determining a mantissa portion matrix, $R_\alpha^{QP \% P}$;
   - determining an exponential portion, depending on QP/P;
   - computing reconstructed transform coefficients ($\tilde{w}_\alpha$) wherein $\tilde{w}_\alpha=[c_\alpha \cdot R_\alpha^{QP \% P}]<<(QP/P)$;
   - performing an inverse transformation on said reconstructed transform coefficients ($\tilde{w}_\alpha$) thereby yielding transformed samples ($\tilde{x}'_\alpha$);
   - computing reconstructed samples, ($x''_\alpha$) using a formula equivalent to $\tilde{x}''_\alpha=(\tilde{x}'_\alpha+(1<<(M-1)))>>M$, wherein M is a constant normalization factor.

7. An apparatus for reconstruction of a compressed image signal by dequantization and inverse transformation of an image difference signal, said apparatus comprising:
   - a coefficient receiver for receiving a plurality of quantized coefficient levels that define an image;
   - a quantization parameter receiver for receiving a quantization parameter (QP);
   - a mantissa portion processor for determining a periodic mantissa portion matrix depending on QP % P using a constant parameter (P);
   - an exponential portion processor for determining an exponential portion depending on QP/P;
   - a transform coefficient processor for computing reconstructed transform coefficients from said plurality of quantized coefficient levels, said periodic mantissa portion and said exponential portion;
   - a transformation processor for performing an inverse transformation on said reconstructed transform coefficients thereby yielding scaled samples;
   - a reconstructed sample processor for computing reconstructed samples, by normalizing the scaled samples using a constant normalization factor (M).

* * * * *